United States Patent
Fisher et al.

(10) Patent No.: US 8,865,502 B2
(45) Date of Patent: Oct. 21, 2014

(54) SOLAR CELLS WITH PLATED BACK SIDE SURFACE FIELD AND BACK SIDE ELECTRICAL CONTACT AND METHOD OF FABRICATING SAME

(75) Inventors: Kathryn C. Fisher, Brooklyn, NY (US); Nicholas C. M. Fuller, North Hills, NY (US); Satyavolu S. Papa Rao, Poughkeepsie, NY (US); Xiaoyan Shao, Yorktown Heights, NY (US); Jeffrey Hedrick, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 719 days.

(21) Appl. No.: 12/813,087

(22) Filed: Jun. 10, 2010

(65) Prior Publication Data
US 2011/0303274 A1    Dec. 15, 2011

(51) Int. Cl.
*H01L 31/0236* (2006.01)
*H01L 31/068* (2012.01)
*H01L 31/0224* (2006.01)
*H01L 31/18* (2006.01)

(52) U.S. Cl.
CPC .......... *H01L 31/1804* (2013.01); *H01L 31/068* (2013.01); *H01L 31/022425* (2013.01); *Y02E 10/547* (2013.01)
USPC ............... 438/57; 53/157; 136/249; 136/256; 136/258

(58) Field of Classification Search
CPC ......................... H01L 31/022425; H01L 31/18
USPC .............................. 136/249, 256, 258; 53/157
See application file for complete search history.

(56) References Cited

U.S. PATENT DOCUMENTS

| | | | |
|---|---|---|---|
| 5,766,964 A * | 6/1998 | Rohatgi et al. | 438/72 |
| 7,704,866 B2 * | 4/2010 | Vanheusden et al. | 438/533 |
| 2005/0074917 A1 * | 4/2005 | Mason et al. | 438/83 |
| 2007/0190341 A1 * | 8/2007 | Furuya et al. | 428/446 |
| 2008/0035489 A1 * | 2/2008 | Allardyce et al. | 205/263 |
| 2009/0038947 A1 * | 2/2009 | Dubin et al. | 205/101 |

(Continued)

FOREIGN PATENT DOCUMENTS

WO    WO2010151478 A1    12/2010

OTHER PUBLICATIONS

International Search Report and Written Opinion dated Apr. 23, 2012 received in a corresponding foreign application.
Oskam, G., et al., "In Situ Measurements of Interface States at Silicon Surfaces in Fluoride Solutions", Physical Review Letters, Feb. 26, 1996, vol. 76, No. 9, pp. 1521-1524.

(Continued)

*Primary Examiner* — Tom Thomas
*Assistant Examiner* — John Bodnar
(74) *Attorney, Agent, or Firm* — Scully, Scott, Murphy & Presser, P.C.; Louis J. Percello, Esq.

(57) ABSTRACT

The present disclosure provides a method of forming a back side surface field of a solar cell without utilizing screen printing. The method includes first forming a p-type dopant layer directly on the back side surface of the semiconductor substrate that includes a p/n junction utilizing an electrodeposition method. The p/n junction is defined as the interface that is formed between an n-type semiconductor portion of the substrate and an underlying p-type semiconductor portion of the substrate. The plated structure is then annealed to from a P++ back side surface field layer directly on the back side surface of the semiconductor substrate. Optionally, a metallic film can be electrodeposited on an exposed surface of the P++ back side surface layer.

18 Claims, 2 Drawing Sheets

(56) References Cited

U.S. PATENT DOCUMENTS

| | | |
|---|---|---|
| 2009/0159111 A1 | 6/2009 | Jawarani et al. |
| 2009/0301549 A1* | 12/2009 | Moslehi .................. 136/251 |
| 2010/0116316 A1* | 5/2010 | Moslehi et al. ............. 136/244 |
| 2010/0275982 A1* | 11/2010 | Abbott et al. ................ 136/255 |

OTHER PUBLICATIONS

Oskam, G., et al., "Electrochemical deposition of metals onto silicon", J. Phys. D: Appl. Phys. 31, 1998, pp. 1927-1949.

U.S. Appl. No. 12/762,665 entitled, "Method of Direct Electrodeposition on Semiconductors" filed Apr. 19, 2010, First Named Inventor: Laura L. Kosbar.

\* cited by examiner

SOLAR CELLS WITH PLATED BACK SIDE SURFACE FIELD AND BACK SIDE ELECTRICAL CONTACT AND METHOD OF FABRICATING SAME

BACKGROUND

The present invention relates to photovoltaic solar cells and photovoltaic solar cell manufacturing. More particularly, the present invention provides a photovoltaic solar cell with an electroplated back side surface field and a back side electrical contact.

Photovoltaic solar cells, i.e., devices which convert photons from sunlight into electricity, are regarded as one of the key technologies which will lead to a sustainable energy future. In order for solar energy to be cost competitive and comparable with non-renewable sources of energy (such as, for example, oil, coal and natural gas), low cost processing and high efficiency solar cells are essential.

The majority (over 90%) of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

For advanced and experimental high efficiency solar cells, such as Sunpower's interdigitated, backcontacted solar cells, vacuum based metallization processes are used to avoid the disadvantages of screen printing. The high cost and low throughput of vacuum processes prohibit the implementation of these processes in single emitter solar cells, which types of solar cells are the majority in the current photovoltaic industry.

SUMMARY

This disclosure provides an alternative to prior art back side screen printing processes in which metallic paste compositions are employed to form electrical contacts on the back side surface of a semiconductor substrate that includes a p-n junction. In the present disclosure, a layer containing a high concentration of p-type dopant atoms, such as B, Al, Ga and/or In, is formed directly on the back side surface of the semiconductor substrate that includes a p/n junction utilizing an electrodeposition method. The p/n junction is defined as the interface that is formed between an n-type semiconductor portion of the substrate and an underlying p-type semiconductor portion of the substrate. As such, the layer containing the high concentration of p-type dopant atoms is formed directly on the p-type semiconductor portion of the semiconductor substrate.

The plated structure is then annealed to form a P++ back side surface field layer at the back side surface of the semiconductor substrate. During the anneal, the layer containing the high concentration of dopant atoms can be completely incorporated/consumed into the p-type portion of the semiconductor substrate. As such, and in some embodiments, the thickness of the semiconductor substrate can increase due to the incorporation of the p-type dopant layer. In other embodiments, the change in semiconductor substrate thickness is negligible. The term "P++ back side surface field layer" is used throughout this disclosure to denote a layer located at the back side surface of a semiconductor substrate having a concentration of p-type dopants which is much higher (typically on the order of 1e4 to 1e6 times) as compared to the p-type dopant concentration that is located within the remaining p-type semiconductor portion of the substrate. Optionally, a metallic film can be electrodeposited on an exposed surface of the P++ back side surface layer.

In one aspect of the invention, a method of fabricating a solar cell is provided that includes providing a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. After providing such a semiconductor substrate, a p-type dopant layer is formed directly on the back side surface. The p-type dopant layer is formed by electroplating at least one p-type dopant atom from an electroplating bath. A thermal anneal step follows the formation of the p-type dopant layer which converts a portion of the p-type semiconductor portion of the semiconductor substrate (which is located at the interface with the p-type dopant layer) and the p-type dopant layer into a P++ doped back side surface field layer. During the anneal, the p-type dopant layer can be completely incorporated/consumed into the p-type semiconductor portion of the semiconductor substrate. In some embodiments, the thickness of the semiconductor substrate can increase due to the incorporation of the p-type dopant layer. In other embodiments, the change in semiconductor substrate thickness is negligible. A metallic film can, in some embodiments, be formed directly on the P++ doped back side surface field layer by electrodeposition.

In another aspect of the invention, a method of fabricating a solar cell is provided that includes providing a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. After providing such a semiconductor substrate, a p-type dopant layer is formed directly on the back side surface. The p-type dopant layer is formed by electroplating at least one p-type dopant atom from an electroplating bath. A thermal anneal step follows the formation of the p-type dopant layer which converts a portion of the p-type semiconductor portion of the semiconductor substrate (which is located at the interface with the p-type dopant layer) and the p-type dopant layer into a P++ doped back side surface field layer. During the anneal, the p-type dopant layer can be completely incorporated/consumed into the p-type semiconductor portion of the semiconductor substrate. In some embodiments, the thickness of the semiconductor substrate can increase due to the incorporation of the p-type dopant layer. In other embodiments, the change in semiconductor substrate thickness is negligible. The upper surface of the P++ doped back side surface field layer is then cleaned to eliminate native oxide formation. Next, a metallic film is formed on an exposed surface of the P++ doped back side surface field layer. The metallic film is formed by selecting a metal or metal alloy including at least one of Ni, Co, Cu, Al, Ag, Au, Zn, Pt and Fe, and electroplating the metal or metal alloy from an electroplating bath.

In yet a further aspect of the invention, a solar cell is provided that includes a semiconductor substrate including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;

and a P++ doped back side surface field layer located at the back side surface of the semiconductor substrate.

DETAILED DESCRIPTION

The present invention, which provides a photovoltaic solar cell with an electroplated back side surface field and a back side electrical contact and a method of fabricating such a solar cell, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
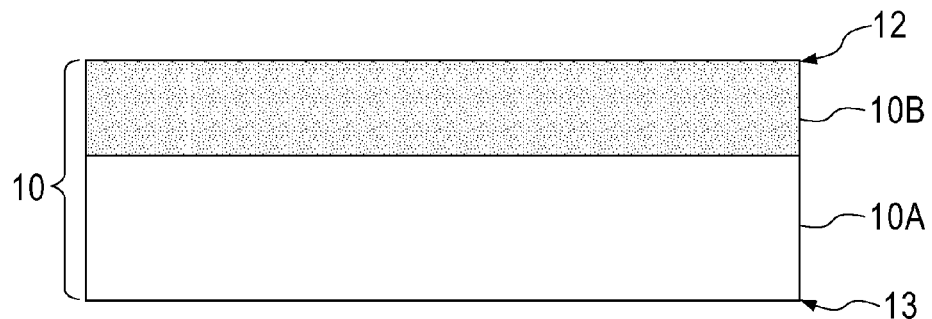
FIG. 1 is a pictorial representation (through a cross sectional view) illustrating an initial structure that can be employed in one embodiment of the present disclosure.

Referring now to FIG. 1, there is illustrated an initial structure 8 that can be employed in one embodiment of the invention. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP and all other III/V or II/VI compound semiconductors. In one embodiment of the present invention, the semiconductor substrate 10 is comprised of Si. In another embodiment, the semiconductor substrate 10 is comprised of a single crystalline semiconductor material. In yet another embodiment, the semiconductor substrate 10 is comprised of a multicrystalline semiconductor material.

The semiconductor substrate 10 illustrated in FIG. 1 includes a p-type semiconductor portion 10A that includes a p-type dopant, and an overlying n-type semiconductor portion 10B that includes an n-type dopant. The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor material and the type of dopant atom being employed. In the particular embodiment shown in FIG. 1, the p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments of the invention, the dopant(s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of the single crystalline silicon semiconductor substrate 10. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

In one embodiment and as shown in the drawings, the front side surface 12 of the semiconductor substrate 10 is bare. In another embodiment of the present invention (not shown), the front side surface 12 of the semiconductor substrate is processed to include a metallic front side grid thereon. When a metallic front side grid is present on the front side surface 12 of the semiconductor substrate 10, any conventional process including formation of a patterned antireflective coating and subsequent screening printing can be employed. In an alternative embodiment of the invention, the metallic front side grid can be formed utilizing the method disclosed in co-pending and co-assigned U.S. application Ser. No. 12/762,665, entitled "METHOD OF DIRECT ELECTRODEPOSITION ON SEMICONDUCTORS", filed Apr. 19, 2010. The entire content of U.S. application Ser. No. 12/762,665 is incorporated herein by reference.

Figure 2:
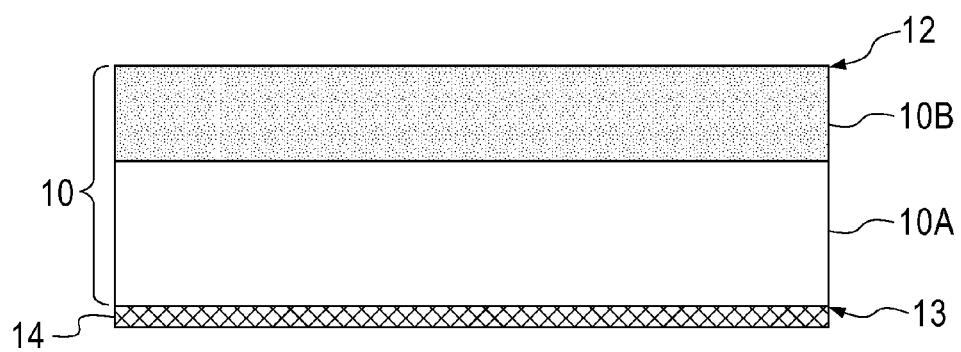
FIG. 2 is a pictorial representation (through a cross sectional view) illustrating the structure of FIG. 1 after forming an electroplated p-type dopant layer on a back side surface of the initial structure.

Referring now to FIG. 2, there is shown the structure of FIG. 1 after forming an electrodeposited p-type dopant layer 14 on the back side surface 13 of the semiconductor substrate 10 shown in FIG. 1. The electrodeposited p-type dopant layer 14 that is formed on the back side surface 13 of the semiconductor substrate 10 includes at least one an atom from Group IIIA of the Periodic Table of Elements including, for example, B, Al, Ga and/or In.

In some embodiments, and prior to the formation of the electrodeposited p-type dopant layer 14, the exposed surface(s) of the semiconductor substrate 10 can be cleaned using a conventional cleaning process that is well known to those skilled in the art which is capable of removing surface oxides and other contaminants from the exposed surface(s) of the semiconductor substrate 10. For example, a dilute HF solution having a concentration between 0.5%-15% can be used to clean the exposed surface(s) of the semiconductor substrate 10.

As mentioned above, the electrodeposited p-type dopant layer 14 is formed by an electrodeposition method. The electrodeposition method used in forming the electrodeposited p-type dopant layer 14 includes the use of any conventional electrodeposition or electroplating apparatus that is well known to those skilled in the art. A soluble or insoluble anode may be used with the plating bath. Typically, the anode is placed parallel to the back side surface 13 of the semiconductor substrate 10, and a cathode is in contact with the front side surface 12 of the semiconductor substrate 10; the cathode is not however in contact with the plating solution.

The electrodeposition method employed in forming the electrodeposited p-type dopant layer 14 also includes the use of any conventional electroplating bath (or composition). The electroplating bath includes one or more sources of p-type dopant ions to plate the electrodeposited p-type dopant layer 14. The one or more sources of p-type dopant ions provide p-type dopant ions which include, but are not limited to, B, Al, Ga and In. Alloys that can be electrodeposited (or plated) include, but are not limited to, binary and ternary alloys of the foregoing p-type dopants.

When boron (B) is to be electroplated, the electroplating of boron can be achieved utilizing solutions containing B-containing alloys including, but not limited to, $B_2O_3$, $B(OH)_3$, MoB, PdB, NiB, CoB, CuB, ZnB, PtB, AgB, PdB, SnB, and FeB. Typical boron-containing compounds used in electroplating of boron alloys include, but are not limited to, dimethylamine-borane (DMAH), and boron hydride.

When aluminum (Al) is to be electroplated, the electroplating of aluminum can be achieved using commercial aluminum baths. Currently most suitable Al plating solutions are non-aqueous ionic liquids, such as $AlCl_3$ in 1-ethyl-3-methylimidazoline chloride (EMImCl).

When gallium (Ga) is to be electrodeposited, the electroplating of gallium can be achieved using Ga-containing salts, acids, organic solvents, and other additives. Ga-containing salts include but are not limited to, Ga chloride, Ga sulfate, Ga sulfamate, Ga acetate, Ga carbonate, Ga nitrate, Ga perchlorate, Ga phosphate, Ga oxide, and Ga hydroxide.

When indium (In) is to be electrodeposited, the electroplating of In can be achieved using, for example, indium sulfamate, indium sulfate, indium cyanide and indium fluoborate baths.

In general, the p-dopant ions are included in the electroplating bath such that p-type dopant ions range in concentrations from 0.01 g/L to 200 g/L, or such as from 0.5 g/L to 150 g/L, or such as from 1 g/L to 100 g/L, or such as from 5 g/L to 50 g/L. Typically, p-type dopant ions are included in amounts such that p-type dopant ion concentrations range from 0.01 to 100 g/L, more typically from 0.1 g/L to 60 g/L.

The electroplating bath that can be used may include one or more conventional diluents. Typically, the electroplating bath is aqueous; however, conventional organic diluents may be used if desired. Non-aqueous ionic liquids are commonly used to plate Al. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds. Additional additives may be included in the plating baths to tailor the performance of the plating for a particular substrate. Such additional additives may include, but are not limited to, levelers and compounds which affect throwing power.

In addition to the above, the electroplating bath may also include hardeners, malleability, ductility and deposition modifiers, suppressants and the like.

The electroplating baths are typically maintained in a temperature range of from 20° C. to 110° C., with a temperature from 20° C. to 50° C. being more typical. Plating temperatures may vary depending on the material to be plated. Typically, electroplating is performed at a temperature from 10° C. to 50° C., with a plating temperature from 20° C. to 40° C. being more typical.

In one embodiment of the present application, the electrodeposition process employed in forming the electrodeposited p-type dopant layer 14 uses current waveforms that apply a low current density initially, and after a predetermined period of time, the current density is increased to a high current density. The specific waveforms that are employed can be continuously applied or pulsed waveforms can be employed in the present invention. It has been determined that the use of the aforementioned current waveform (e.g., low current density to high current density) overcomes the non-uniformity problem that exists during prior art electrodeposition processes.

The low current density that is initially used to plate the p-type dopants from the plating bath is typically within a range from 1 mAmps/$cm^2$ to 40 mAmps/$cm^2$, with a current density from 5 mAmps/$cm^2$ to 20 mAmps/$cm^2$ being more typical. Plating within the low current density regime is typically performed for a time period from 5 seconds to 120 seconds, with a time period from 10 seconds to 60 seconds being more typical. After this initial period of time in which plating occurs using the low current density mentioned above, the current density is increased to a high current density regime. The high current density regime typically employs a current density of greater than 40 mAmps/$cm^2$, with a current density from greater than 40 mAmps/$cm^2$ to 200 mAmps/$cm^2$ being more typical. Plating within the high current density regime is typically performed for a time period from 1 second to 1 hour, with a time period from 5 seconds to 300 seconds being more typical.

The increase from the low current density regime to the high current density regime may include a continuous ramp or it may include various ramp and soak cycles including a sequence of constant current plateaus. When a continuous ramp is employed, the rate of increase can be from 1 mAmp/cm$^2$/sec to 100 mAmp/cm$^2$/sec. The same ramp rate can be used in the various ramp and soak cycles and the soak at a desired current density may vary and is not critical to the practice of the present invention.

Although the electrodeposition of the electrodeposited p-type dopant layer 14 is described using the aforementioned current waveform (i.e., from a low current density to a high current density), the electrodeposition of the electrodeposited p-type dopant layer 14 can also be performed utilizing other current waveforms, i.e., from high to low, or a single waveform.

The thickness of the electrodeposited p-type dopant layer 14 may vary depending on the conditions of the electrodeposition process that is employed to plate the p-type dopant onto the back side surface 13. Typically, the electrodeposited p-type dopant layer 14 has a thickness from 100 Å to 10000 Å, with a thickness from 500 Å to 5000 Å being more typical. Moreover, the electrodeposition method that includes current waveforms from low to high provides complete coverage of the electrodeposited p-type dopant layer 14 on the back side surface 13 of the semiconductor substrate 10. By "complete coverage", it is meant that the electrodeposited p-type dopant layer 14 is continuously present on the entire back side surface 13 of the semiconductor substrate 10.

The concentration of p-type dopant present in the electrodeposited p-type dopant layer 14 may vary depending on the conditions of the electrodeposition process including the content of p-type dopants within the electroplating bath. Typically, the concentration of p-type dopant present in the electrodeposited p-type dopant layer 14 is from 1e21 atoms/cm$^3$ to 6e23 atoms/cm$^3$, with a p-type dopant concentration from 1e22 atoms/cm$^3$ to 6e23 atoms/cm$^3$ being more typical.

Figure 3:
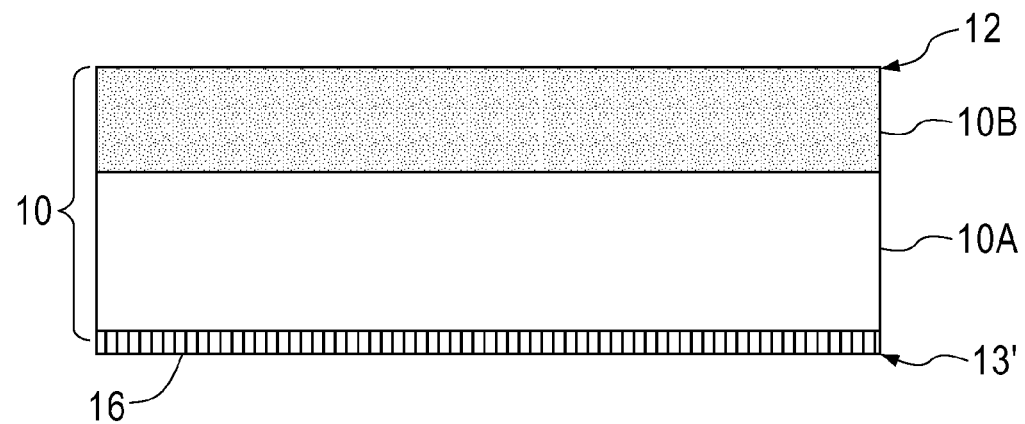
FIG. 3 is a pictorial representation (through a cross sectional view) illustrating the structure of FIG. 2 after annealing to form a P++ doped back side surface field layer.

Referring now to FIG. 3, there is shown the structure of FIG. 2 after performing a thermal anneal which drives the electrodeposited p-type dopant atoms from the p-type dopant layer 14 into a portion of the p-type semiconductor portion 10A of the semiconductor substrate forming a P++ doped back side surface field layer 16. As shown in FIG. 3, the anneal can completely incorporate/consume the p-type dopant layer 14 into the p-type semiconductor portion 10A of the semiconductor substrate 10. In some embodiments (as shown in FIG. 3), the thickness of the semiconductor substrate can increase due to the incorporation of the p-type dopant layer. To show the increase in thickness that can be obtained, the size of the original brackets denoting substrate 10 have been maintained. In other embodiments, the change in semiconductor substrate thickness is negligible. It is observed that in FIG. 3, reference numeral 13' denotes the new back side surface of the structure that is formed.

The concentration of p-type dopant within the P++ doped back side surface field layer 16 is thus greater than the concentration of p-type dopant within the original electrodeposited p-type dopant layer 14 which is now incorporated/consumed into the p-type semiconductor portion 10A of the semiconductor substrate 10. Typically, the concentration of p-type dopant present in the P++ doped back side surface field layer 16 is from 1e19 atoms/cm$^3$ to 1e23 atoms/cm$^3$, with a p-type dopant concentration from 1e20 atoms/cm$^3$ to 1e22 atoms/cm$^3$ being more typical.

The thermal anneal may be performed in a single step or a two-step anneal process can be used. The temperature of the thermal anneal may vary. Typically, the thermal anneal is performed at a temperature from 250° C. or greater, with a temperature from 400° C. to 900° C. being more typical. Thermal annealing can be performed in a forming gas, air, $O_2$, He, Ar, or $N_2$. The thermal anneal includes a furnace anneal, a rapid thermal anneal, a belt furnace anneal, a spike anneal, a microwave anneal or a laser anneal. Typically, the thermal anneal is a rapid thermal anneal in which the anneal time is about typically less than 10 minutes.

The thickness of the resultant P++ doped back side surface field layer 16 is in the range of 1 micrometer to 50 micrometer, with 5 micrometer to 25 micrometer being more typical.

Figure 4:
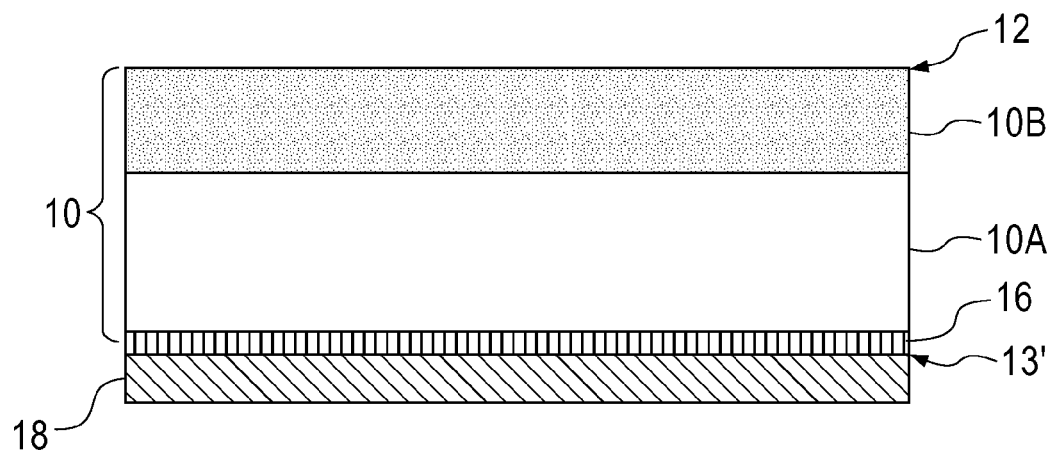
FIG. 4 is a pictorial representation (through a cross sectional view) illustrating the structure of FIG. 3 after forming a metallic film on the P++ back side surface field layer.

Referring now to FIG. 4, there is illustrated the structure of FIG. 3 after forming a metallic film 18 atop the P++ doped back side surface field layer 16. In some embodiments, the metallic film 18 can be omitted. When present, the metallic film 18 forms a back side electrical contact of the inventive solar cell.

When present the metallic film 18 comprises Ni, Co, Cu, Al, Ag, Au, Zn, Pt, Fe or alloys thereof. In one embodiment, the metallic film 18 is comprised of Ni, Co or Cu. In another embodiment, the metallic film 18 is comprised of Ni or a Ni alloy with thick Cu layer as the final electrode surface.

The metallic film 18 can be formed utilizing electrodeposition. The electrodeposition method of employed in forming the metallic film 18 also includes the use of any conventional electroplating bath (or composition). The electroplating bath includes one or more sources of metal ions to plate metals. The one or more sources of metal ions provide metal ions which include, but are not limited to Ni, Co, Cu, Zn, Pt, Ag, Au, Al, Pd, Sn, Fe and In. Alloys that can be electrodeposited (or plated) include, but are not limited to, binary and ternary alloys of the foregoing metals. Typically, metals chosen from Ni, Co, Pd, Ag, Au, Al, and Pt are plated from the electroplating bath. More typically, Ni or a Ni alloy is plated from the electroplating bath.

The one or more sources of ions that can be present in the electroplating bath include metal salts or ammonium salts. The salts that can be used include, but are not limited to, halides, nitrates, sulfates, alkane sulfonates, alkanol sulfonate, cyanides, acetates or citrates.

Some of the various types of metal salts that can be employed in the present invention are now described in greater detail. Nickel (Ni) salts which may be used in the electroplating bath include, but are not limited to, one or more of nickel chloride, nickel sulfamate, nickel acetate, nickel ammonium sulfate, and nickel sulfate.

Sources of cobalt (Co) ions include, but are not limited to, one or more of cobalt ammonium sulfate, cobalt acetate, cobalt sulfate and cobalt chloride. Sources of zinc (Zn) ions include, but are not limited to, one or more of zinc bromate, zinc chloride, zinc nitrate and zinc sulfate. Source of iron (Fe) include, but are not limited to, one or more of ferric or ferrous chloride, iron nitrate, iron sulfate, iron acetate, and iron sulfate.

Palladium (Pd) salts which may be used in the electroplating bath include, but are not limited to, one or more of palladium chloride, palladium nitrate, palladium potassium chloride and palladium potassium chloride.

Silver (Ag) salts which may be used in the electroplating bath include, but are not limited to, one or more of silver nitrate, silver sulfate, and silver cyanide.

Gold (Au) salts which may be used in the electroplating bath include, but are not limited to, one or more of gold cyanide, gold sulfate, gold nitrate and gold chloride.

Aluminum (Al) salts which may be used in the electroplating bath include, but are not limited to, one or more of $AlCl_3$-EMImCl (1-Ethyl-3-Methylimidazoline chloride), and $AlCl_3$-EMImPF$_6$.

Platinum (Pt) salts which may be used include, but are not limited to, one or more of platinum tetrachloride, platinum sulfate and sodium chloroplatinate.

In one embodiment of the present disclosure, the plating bath used in forming the metallic film 18 is composed of nickel sulfamate and boric acid without any organic additives.

The measured pH of the electroplating bath used in forming the metallic film 18 may be buffered using conventional buffering compounds.

The electroplating baths used in forming the metallic film 18 are typically maintained in a temperature range of from 20° C. to 110° C., with a temperature from 20° C. to 50° C. being more typical. Plating temperatures used in forming the metallic film 18 may vary depending on the metal to be plated. Typically, electroplating used in forming the metallic film 18 is performed at a temperature from 10° C. to 50° C., with a plating temperature from 20° C. to 40° C. being more typical.

In one embodiment of the present application, the electrodeposition process employed in forming the metallic film 18 uses current waveforms that apply a low current density initially, and after a predetermined period of time, the current density is increased to a high current density. The specific waveforms that are employed can be continuously applied or pulsed waveforms can be employed in the present invention. It has been determined that the use of the aforementioned current waveform (e.g., low current density to high current density) overcomes the non-uniformity problem that exists during prior art electrodeposition processes.

The low current density that is initially used to plate the metal or metal alloy from the plating bath is typically within a range from 1 mAmps/cm$^2$ to 40 mAmps/cm$^2$, with a current density from 5 mAmps/cm$^2$ to 20 mAmps/cm$^2$ being more typical. Plating within the low current density regime is typically performed for a time period from 5 seconds to 120 seconds, with a time period from 10 seconds to 60 seconds being more typical. After this initial period of time in which plating occurs using the low current density mentioned above, the current density is increased to a high current density regime. The high current density regime typically employs a current density of greater than 40 mAmps/cm$^2$, with a current density from greater than 40 mAmps/cm$^2$ to 200 mAmps/cm$^2$ being more typical. Plating within the high current density regime is typically performed for a time period from 1 second to 1 hour, with a time period from 5 seconds to 300 seconds being more typical.

The increase from the low current density regime to the high current density regime may include a continuous ramp or it may include various ramp and soak cycles including a sequence of constant current plateaus. When a continuous ramp is employed, the rate of increase can be from 1 mAmp/cm$^2$/sec to 100 mAmp/cm$^2$/sec. The same ramp rate can be used in the various ramp and soak cycles and the soak at a desired current density may vary and is not critical to the practice of the present invention.

Although the electrodeposition of the metallic film 18 is described using the aforementioned current waveforms (i.e., from a low current density to a high current density), the electrodeposition deposition of the metallic film 18 can also be performed utilizing other current waveforms, i.e., from high to low, or a single waveform. In some embodiments, light illumination can be used during the electrodeposition process.

The thickness of the metallic film 18 may vary depending on the type of metal or metal alloy employed as well as the conditions and waveforms used during the electrodeposition process. Typically, the metallic film 18 has a thickness from 50 Å to 50000 Å, with a thickness from 500 Å to 20000 Å being more typical.

In some embodiments, and prior to forming the metallic film 18, the exposed surface of the P++ doped back side surface layer 16 is cleaned utilizing a conventional cleaning process, such as, for example dilute HF clean, which can eliminate native oxides that may form on the P++ doped back side surface layer 16.

In some another embodiments, and if not previously done, a front side metallic grid can be formed on the front side surface 12 of the semiconductor substrate 10 after formation of the P++ doped back side surface field layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a solar cell comprising:
providing a semiconductor substrate of a first thickness and comprising a single semiconductor material layer including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;
forming a p-type dopant layer directly on and in direct physical contact with said back side surface of said p-type semiconductor portion of said semiconductor substrate, wherein said p-type dopant layer is formed by electroplating at least one p-type dopant atom selected from the group consisting of boron, gallium and indium from an electroplating bath; and
thermal annealing said semiconductor substrate and said p-type dopant layer to convert a portion of the p-type semiconductor portion of the semiconductor substrate into a P++ doped semiconductor back side surface field layer, wherein during said thermally annealing said p-type dopant layer is completely consumed and said semiconductor substrate has a second thickness that is greater than the first thickness.

2. The method of claim 1 further comprising forming a metallic film directly on the P++ doped semiconductor back side surface field layer by electrodeposition.

3. The method of claim 1 wherein said providing the semiconductor substrate includes selecting from one of Si, Ge, SiGe, SiC, SiGeC, GaAs, GaN, InAs, InP and all other III/V and II/VI compound semiconductors.

4. The method of claim 1 wherein said n-type semiconductor portion has a sheet resistance of greater than 50 ohm/sq.

5. The method of claim 1 further comprising forming a front side metallic grid on the front side surface of the semiconductor substrate prior to forming said p-type dopant layer.

6. The method of claim 1 wherein said front side surface of the substrate is bare during forming said p-type dopant layer.

7. The method of claim 1 wherein said least one p-type dopant atom is boron.

8. The method of claim 2 wherein said electrodeposition of the metallic film includes using a current waveform comprising a low current density from 5 mAmps/cm$^2$ to 40 mAmps/cm$^2$ performed for a first period of time, followed by a high current density of greater than 40 mAmps/cm$^2$ for a second period of time.

9. The method of claim 1 wherein the thermal annealing is carried out at a temperature of greater than 250° C.

10. The method of claim 2 wherein said forming the metallic film further includes light illumination.

11. The method of claim 2 wherein said forming the metallic film includes selecting a metal or metal alloy including at least one of Ni, Co, Cu, Al, Ag, Au, Zn, Pt and Fe, and electroplating said metal or metal alloy from an electroplating bath.

12. The method of claim 2 further comprising a step of cleaning an upper surface of the P++ doped semiconductor back side surface field layer with dilute HF prior to forming the metallic film.

13. The method of claim 1 wherein said the electroplating the p-type dopant includes a current waveform comprising a low current density from 5 mAmps/cm$^2$ to 40 mAmps/cm$^2$ performed for a first period of time, followed by a high current density of greater than 40 mAmps/cm$^2$ for a second period of time.

14. A method of fabricating a solar cell comprising:
providing a semiconductor substrate of a first thickness and comprising a single semiconductor material layer including a p-type semiconductor portion and an overlying and n-type semiconductor portion, wherein an exposed surface of the p-type semiconductor portion defines a back side surface of the semiconductor substrate and wherein an exposed surface of the n-type semiconductor portion defines a front side surface;
forming a p-type dopant layer directly on said and in direct physical contact with back side surface of said p-type semiconductor portion of said semiconductor substrate, wherein said p-type dopant layer is formed by electroplating at least one p-type dopant atom selected from the group consisting of boron, gallium and indium from an electroplating bath;
thermal annealing said semiconductor substrate and said p-type dopant layer-to convert a portion of the p-type semiconductor portion of the semiconductor substrate into a P++ doped semiconductor back side surface field layer, wherein during said thermally annealing said p-type dopant layer is completely consumed and said semiconductor substrate has a second thickness that is greater than the first thickness;
cleaning an upper surface of the P++ doped semiconductor back side surface field layer; and
forming a metallic film on an exposed surface of the P++ doped semiconductor back side surface field layer, wherein said forming the metallic film includes selecting a metal or metal alloy including at least one of Ni, Co, Cu, Al, Ag, Au, Zn, Pt and Fe, and electroplating said metal or metal alloy from an electroplating bath.

15. The method of claim 1 wherein said thermal annealing drives said at least one p-type dopant atom from said p-type dopant layer into said p-type semiconductor portion.

16. The method of claim 1 wherein said exposed surface of the p-type semiconductor portion is planar and wherein said p-type dopant layer is formed directly on said exposed planar surface of the p-type semiconductor portion.

17. The method of claim 1 wherein said p-type dopant layer has a composition of elements selected from the group consisting of boron, gallium and indium.

18. A method of fabricating a solar cell comprising:
providing a semiconductor substrate of a first thickness and comprising a single semiconductor material layer including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;
forming a layer containing dopant atoms selected from the group consisting of at least one of B, Al, Ge and In and having a dopant concentration from 1e21 atoms/cm$^2$ to 6e23 atoms/cm$^2$ directly on and in direct physical contact with said back side surface of said p-type semiconductor portion of said semiconductor substrate, wherein said p-type dopant layer is formed by electroplating at least one p-type dopant atom from an electroplating bath; and
thermal annealing said semiconductor substrate and said layer containing said dopant atoms to convert a portion of the p-type semiconductor portion of the semiconductor substrate into a P++ doped semiconductor back side surface field layer, wherein during said thermally annealing said layer containing said dopant atoms is completely consumed and said semiconductor substrate has a second thickness that is greater than the first thickness.

* * * * *